US012114482B2

(12) United States Patent
Zhan et al.

(10) Patent No.: US 12,114,482 B2
(45) Date of Patent: Oct. 8, 2024

(54) FABRICATION METHOD OF A MEMORY AND THE MEMORY

(71) Applicant: CHANGXIN MEMORY TECHNOLOGIES, INC., Hefei (CN)

(72) Inventors: Kangshu Zhan, Hefei (CN); Jun Xia, Hefei (CN); Qiang Wan, Hefei (CN); Tao Liu, Hefei (CN); Sen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 519 days.

(21) Appl. No.: 17/403,809

(22) Filed: Aug. 16, 2021

(65) Prior Publication Data
US 2022/0208764 A1   Jun. 30, 2022

Related U.S. Application Data

(63) Continuation of application No. PCT/CN2021/101289, filed on Jun. 21, 2021.

(30) Foreign Application Priority Data

Dec. 30, 2020  (CN) .......................... 202011622620.0

(51) Int. Cl.
*H01L 29/78* (2006.01)
*H01L 21/265* (2006.01)
(Continued)

(52) U.S. Cl.
CPC ....... *H10B 12/33* (2023.02); *H01L 21/26513* (2013.01); *H01L 29/66757* (2013.01);
(Continued)

(58) Field of Classification Search
None
See application file for complete search history.

(56) References Cited

U.S. PATENT DOCUMENTS

| 2008/0285350 A1* | 11/2008 | Yeh | ........................ | H01L 29/792 365/185.17 |
| 2009/0108318 A1* | 4/2009 | Yoon | ...................... | H10B 12/50 257/306 |

(Continued)

OTHER PUBLICATIONS

European Patent Office, Extended European Search Report Issued in Application No. 21773438.3, May 26, 2023, Germany, 8 pages.

*Primary Examiner* — Bilkis Jahan
(74) *Attorney, Agent, or Firm* — Kilpatrick Townsend & Stockton LLP

(57) ABSTRACT

Embodiments provide a memory and a fabrication method thereof, and relates to the field of storage device technology to solve the technical problem of lower storage density of the memory. The fabrication method of the memory includes: providing a substrate including a central region and an edge region connected to each other, a first contact structure electrically connected to a wordline structure in the substrate being formed in the edge region; forming a second contact structure electrically connected to the first contact structure on the edge region; forming a capacitor structure electrically connected to the wordline structure on the central region; forming a third contact structure electrically connected to the second contact structure on the second contact structure; and forming a transistor structure electrically connected to the wordline structure on the capacitor structure and the third contact structure.

15 Claims, 13 Drawing Sheets

(51) Int. Cl.
  *H01L 29/66* (2006.01)
  *H01L 29/786* (2006.01)
  *H10B 12/00* (2023.01)

(52) U.S. Cl.
  CPC ..... *H01L 29/78675* (2013.01); *H10B 12/036* (2023.02); *H10B 12/05* (2023.02)

(56) References Cited

U.S. PATENT DOCUMENTS

| | | | |
|---|---|---|---|
| 2009/0325343 A1* | 12/2009 | Lee | H01L 21/2007 438/455 |
| 2020/0083229 A1* | 3/2020 | Kim | G11C 11/4085 |
| 2020/0350014 A1 | 11/2020 | Liu | |

* cited by examiner

FABRICATION METHOD OF A MEMORY AND THE MEMORY

CROSS-REFERENCE TO RELATED APPLICATIONS

This application is a continuation of PCT/CN2021/101289, filed on Jun. 21, 2021, which claims priority to Chinese Patent Application No. 202011622620.0 titled "MEMORY AND FABRICATION METHOD THEREOF" and filed to the State Intellectual Property Office on Dec. 30, 2020, the entire contents of which are incorporated herein by reference.

TECHNICAL FIELD

The present disclosure relates to the field of memory device technology, and more particularly, to a memory and a fabrication method thereof.

BACKGROUND

With the constant development of semiconductor technologies and storage technologies, electronic devices continue to develop towards miniaturization and integration. Dynamic random access memory (DRAM) is widely applied to various electronic devices due to its higher storage density and faster read-write speed.

The DRAM typically includes a storage array region and a peripheral circuit region arranged around the storage array region. The storage array region is provided with a plurality of capacitors arranged in an array, and the peripheral circuit region is provided with transistors configured to control the plurality of capacitors and contact lines for electrically connecting the transistors. The storage density of the DRAM mainly depends on the density of the capacitors. In the existing technologies, the peripheral circuit region occupies certain space, which limits the range of the storage array region, such that the storage density of the DRAM is lower.

SUMMARY

On this account, the present disclosure provides a memory and a fabrication method thereof, to solve the technical problem of lower storage density of a dynamic random access memory (DRAM).

To achieve the above objective, the present disclosure provides following technical solutions.

In one aspect, the present disclosure provides a fabrication method of a memory. The fabrication method includes: providing a substrate, the substrate comprising a central region and an edge region connected to the central region, a first contact structure being formed in the edge region, and the first contact structure being electrically connected to a wordline structure in the substrate; forming a second contact structure on the edge region, the second contact structure being electrically connected to the first contact structure; forming a capacitor structure on the central region, the capacitor structure being electrically connected to the wordline structure; forming a third contact structure on the second contact structure, the third contact structure being electrically connected to the second contact structure; and forming a transistor structure on the capacitor structure and the third contact structure. The transistor structure is electrically connected to the third contact structure, and an orthographic projection of the transistor structure on the substrate is at least partially coincident with orthographic projections of the capacitor structure and the third contact structure on the substrate.

In a second aspect, the present disclosure also provides a memory, which comprises a substrate. The substrate comprises: a central region and an edge region connected to the central region, a first contact structure being formed in the edge region, and the first contact structure being electrically connected to a wordline structure in the substrate; a capacitor structure, arranged on the central region and electrically connected to the wordline structure; a second contact structure, arranged on the edge region and electrically connected to the first contact structure; a third contact structure, arranged on the second contact structure and electrically connected to the second contact structure; and a transistor structure, arranged on the capacitor structure and the third contact structure. The transistor structure is electrically connected to the third contact structure, and an orthographic projection of the transistor structure on the substrate is at least partially coincident with orthographic projections of the capacitor structure and the wordline structure on the substrate.

DETAILED DESCRIPTION

To increase the storage density of a memory, in the memory provided by the present disclosure, a transistor structure is formed in upper regions of a capacitor structure and a third contact structure. In this way, space of an edge region of the capacitor structure is freed up, such that more capacitors can be arranged in the capacitor structure, and thus the storage density of the memory is increased.

To make the objectives, technical solutions, and advantages of embodiments of the present disclosure clearer, the technical solutions in the embodiments of the present disclosure will be described clearly and completely below with reference to the accompanying drawings in the embodiments of the present disclosure. Apparently, the described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
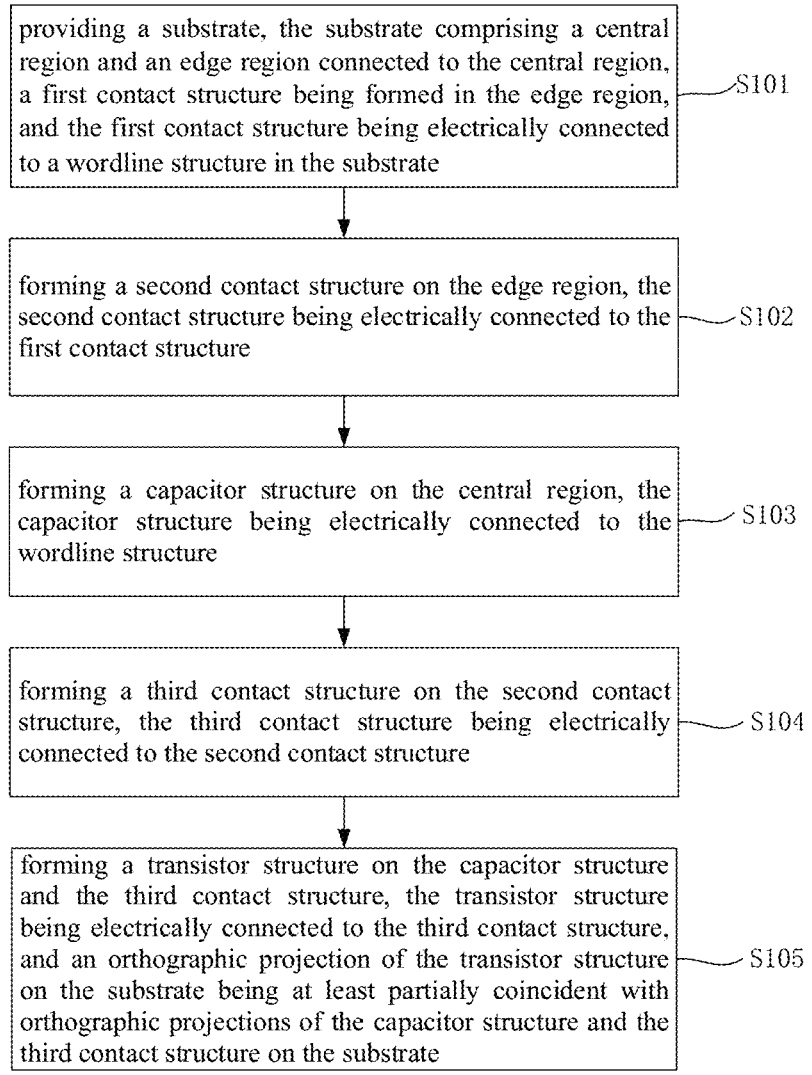
FIG. 1 is a flowchart of a fabrication method of a memory according to the present disclosure.

With reference to FIG. 1, a flowchart of a fabrication method of a memory according to one embodiment of the present disclosure is illustrated. The fabrication method includes following steps.

Step S101, providing a substrate, wherein the substrate comprises a central region and an edge region connected to the central region, a first contact structure is formed in the edge region, and the first contact structure is electrically connected to a wordline structure in the substrate.

Figure 2:
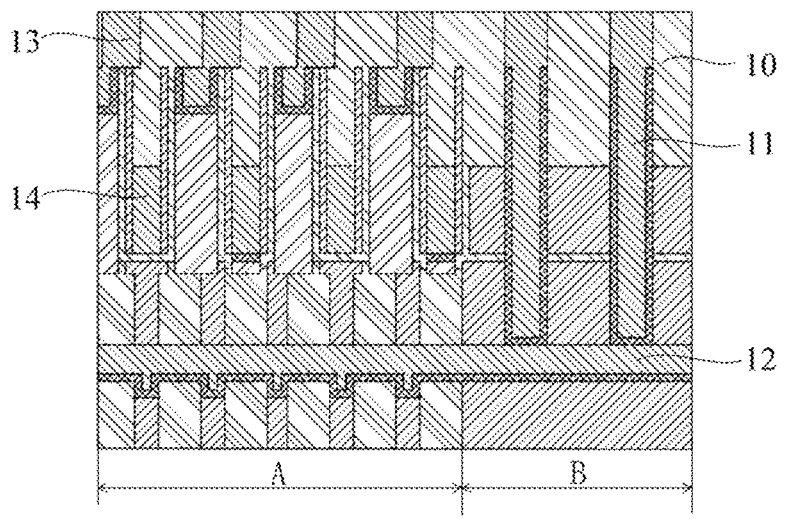
FIG. 2 is a schematic structural diagram of a substrate according to an embodiment of the present disclosure.

As shown in FIG. 2, the substrate 10 in this embodiment of the present disclosure includes a central region and an edge region connected to each other. The central region is a Region A as shown in FIG. 2, and the edge region is a Region B as shown in FIG. 2, wherein the Region A abuts to the Region B. The substrate 10 is also provided with a wordline structure 12, wherein a part of the wordline structure 12 is positioned in the central region, and another part of the wordline structure 12 is positioned in the edge region. That is, the wordline structure 12 penetrates through an interface between the central region and the edge region to implement electrical connection between structures required for the central region and the edge region.

With continued reference to FIG. 2, the edge region is internally provided with a first contact structure 11, wherein an end of the first contact structure 11 is flush with an end of the substrate 10, and another end of the first contact structure 11 is electrically connected to the wordline structure 12. Exemplarily, an upper end of the first contact structure 11 is flush with an upper end of the substrate 10, and a lower end of the first contact structure 11 is in contact with the wordline structure 12, wherein the first contact structure 11 is made from an electrically conductive material. In this way, the electrical connection between the first contact structure 11 and the wordline structure 12 is implemented.

The central region is also internally provided with a bitline structure 14 and a capacitor contact structure 13 arranged at intervals. An end of the capacitor contact structure 13 is electrically connected to the wordline structure 12, and another end of the capacitor contact structure 13 is electrically connected to a capacitor structure 90 formed subsequently, to implement connectivity between the wordline structure 12 and the capacitor structure 90. In this way, the capacitor structure 90 is controlled to read and output data.

Connectivity between the bitline structure 14 and the capacitor contact structure 13 and connectivity between the bitline structure 14 and the wordline structure 12 are disabled, to prevent the occurrence of a short circuit, which may cause the memory to fail to work properly. As shown in FIG. 2, the bitline structure 14 and the capacitor contact structure 13 may be arranged alternately to increase space utilization of the memory.

The bitline structure 14, the capacitor contact structure 13, the wordline structure 12 and the first contact structure 11 may be made from the same material. In some embodiments of the present disclosure, the material of the three structures is metal material, such as tungsten or tungsten alloy. As shown in FIG. 2, a lower surface of the wordline structure 12, a lower surface and a part of lateral surfaces of the capacitor contact structure 13, and a lower surface and a part of lateral surfaces of the first contact structure 11 all include a metal barrier layer such as a titanium nitride layer, to prevent metal from spreading out.

Step S102, forming a second contact structure on the edge region, where the second contact structure is electrically connected to the first contact structure.

With reference to FIGS. 3 to 6, the second contact structure 26 is positioned above the edge region, corresponds to and connects to the first contact structure 11, such that the second contact structure 26 can be electrically connected to the wordline structure 12 in the substrate 10. Exemplarily, the second contact structure 26 is positioned right above the first contact structure 11, the second contact structure 26 and the first contact structure 11 are both made from electrically conductive materials, and the second contact structure 26 is in contact with the first contact structure 11.

It is to be noted that in the related technologies, to improve yield of the memory, two rows and/or two columns of capacitors positioned at the periphery of the capacitor structure 90 generally are not electrically connected. That is, the capacitor structure 90 has non-conducting capacitors. In some embodiments of the present disclosure, the second contact structure 26 is arranged at locations of the non-conducting capacitors. That is, the capacitors in the capacitor structure 90 are electrically connected to the wordline structure 12, which increases utilization of the capacitors in one aspect, and further frees up edge space of the capacitor structure 90 in another aspect, such that that more capacitors can be arranged in the capacitor structure, and thus the storage density of the memory is increased.

Figure 3:
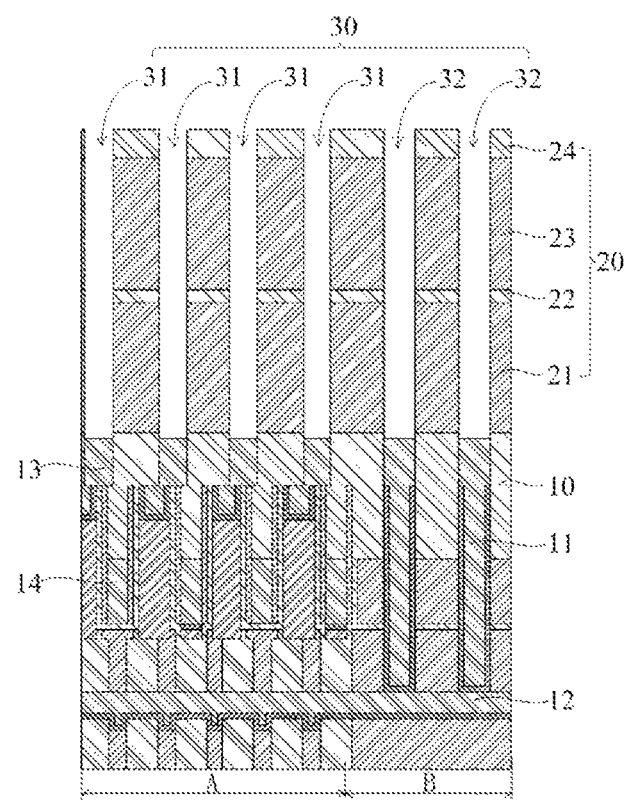
FIG. 3 is a schematic structural diagram of a mask layer formed according to an embodiment of the present disclosure.
Figure 4:
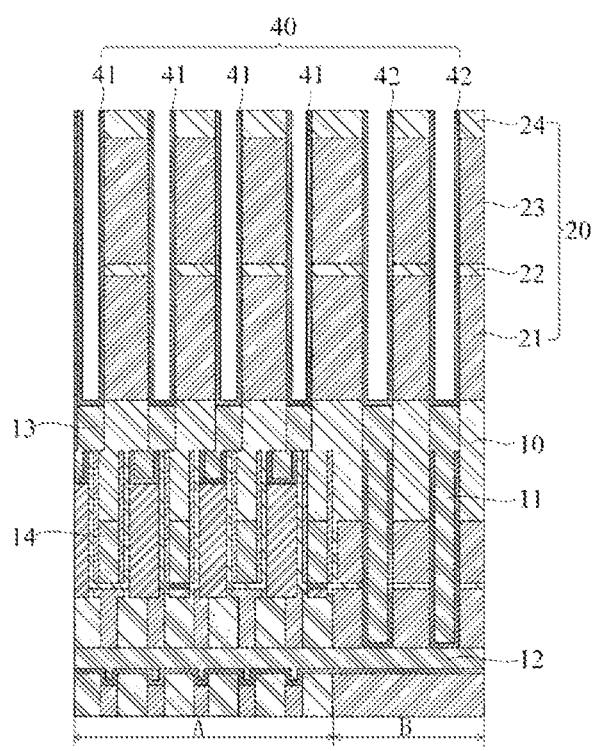
FIG. 4 is a schematic structural diagram of a lower electrode layer formed according to an embodiment of the present disclosure.

With reference to FIG. 3 and FIG. 4, before the second contact structure 26 is formed on the edge region, the fabrication method according to this embodiment of the present disclosure further comprises: forming a mask layer 20 having a hole structure 30 on the substrate 10; and forming a lower electrode layer 40 on an inner surface and a bottom of the hole structure 30 after the mask layer 20 having the hole structure 30 is formed.

In a possible example, forming a mask layer 20 having a hole structure 30 on the substrate 10 may include the following step:

stacking an initial first insulating layer 21, an initial first supporting layer 22, an initial second insulating layer 23 and an initial second supporting layer 24 on the substrate 10. Exemplarily, the initial first insulating layer 21, the initial first supporting layer 22, the initial second insulating layer 23 and the initial second supporting layer 24 are deposited and formed on the substrate 10 in sequence by means of a chemical vapor deposition or physical vapor deposition. Materials of the initial first insulating layer 21 and the initial second insulating layer 23 may be silicon oxide, and materials of the initial first supporting layer 22 and the initial second supporting layer 24 may be silicon nitride.

After the initial first insulating layer 21, the initial first supporting layer 22, the initial second insulating layer 23 and the initial second supporting layer 24 are stacked on the substrate 10, a part of the initial first insulating layer 21, a part of the initial first supporting layer 22, a part of the initial second insulating layer 23 and a part of the initial second supporting layer 24 are removed by etching to form a first insulating layer 21 having the hole structure 30, a first supporting layer 22 having the hole structure 30, a second insulating layer 23 having the hole structure 30, and a second supporting layer 24 having the hole structure 30. The first insulating layer 21, the first supporting layer 22, the second insulating layer 23 and the second supporting layer 24 constitute the mask layer 20.

With reference to FIG. 3, the hole structure 30 includes a first hole structure 31 and a second hole structure 32, wherein the first hole structure 31 is positioned on the central region, and the second hole structure 32 is positioned on the edge region. The first hole structure 31 exposes the capacitor contact structure 13, and the second hole structure 32 exposes the first contact structure 11. In some embodiments of the present disclosure, the first hole structure 31 and the second hole structure 32 may be straight-through holes penetrating through the mask layer 20.

With reference to FIG. 4, the lower electrode layer 40 includes a first lower electrode layer 41 and a second lower electrode layer 42, wherein the first lower electrode layer 41 is arranged in the first hole structure 31, and the second lower electrode layer 42 is arranged in the second hole structure 32. That is, the first lower electrode layer 41 is positioned on the central region and is electrically connected to the capacitor contact structure 13. The second lower electrode layer 42 is positioned on the edge region and is electrically connected to the first contact structure 11.

Figure 5:
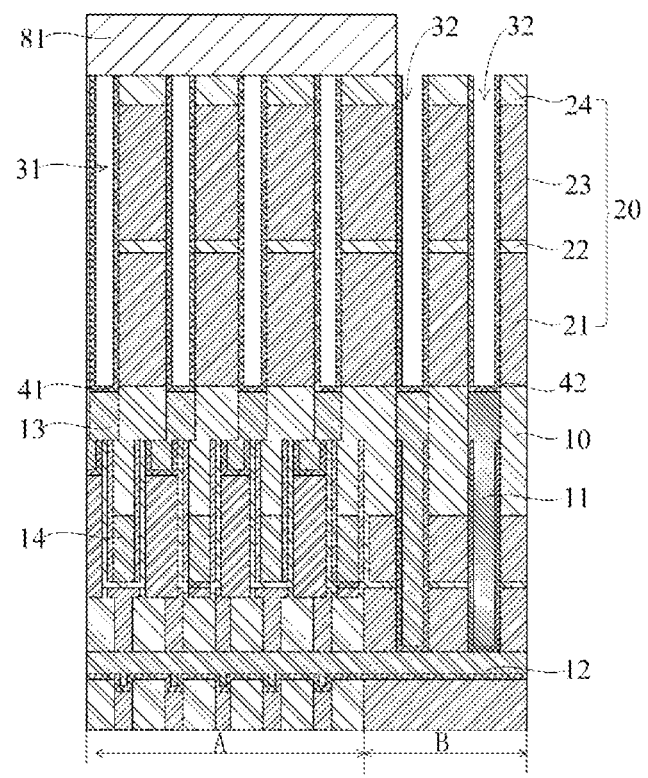
FIG. 5 is a schematic structural diagram of a first photoresist layer formed according to an embodiment of the present disclosure.
Figure 6:
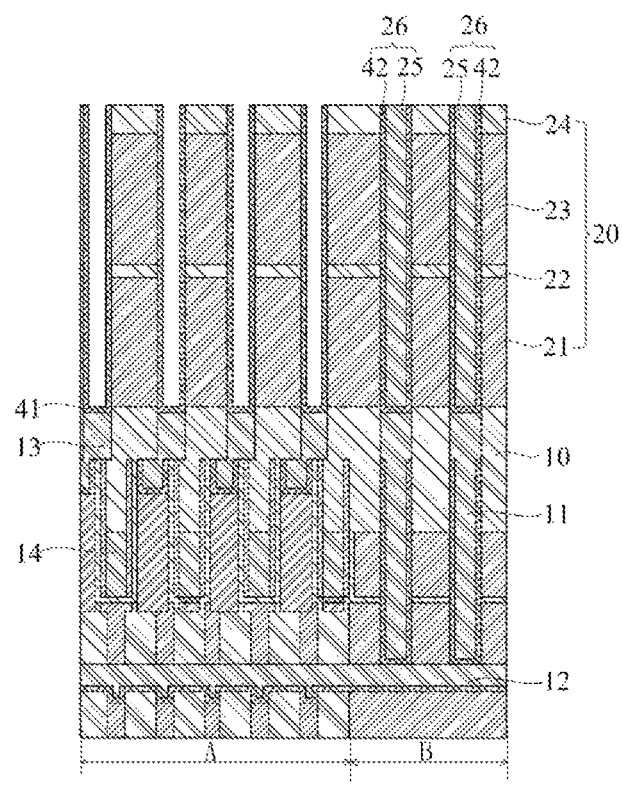
FIG. 6 is a schematic structural diagram of a second contact structure formed according to an embodiment of the present disclosure.

In some embodiments of the present disclosure, with reference to FIG. 5 and FIG. 6, the second contact structure 26 may be formed on the edge region through the following process.

First, with reference to FIG. 5, a first photoresist layer 81 is formed on the central region, and the first photoresist layer 81 covers the first hole structure 31 and a part of the mask layer 20. The first photoresist layer 81 may be formed on the central region by means of a spin coating process, and it may be ensured that the first photoresist layer 81 is not arranged in the first hole structure 31 by adjusting process parameters. As shown in FIG. 5, the first photoresist layer 81 is formed on a region in the mask layer 20 corresponding to the central region of the substrate 10, and the second hole structure 32 is exposed, to facilitate deposition of the first photoresist layer 81 into the second hole structure 32.

With reference to FIG. 6, after the first photoresist layer 81 is formed on the central region, a first conductive layer 25 is formed in the second hole structure 32, and the first conductive layer 25 and the second lower electrode layer 42 constitute the second contact structure 26. Exemplarily, the first conductive layer 25 may be formed by depositing an electrically conductive material into the second hole structure 32, and the first conductive layer 25 fills up the second hole structure 32. The first conductive layer 25 may be a tungsten layer or a tungsten alloy layer.

After the first conductive layer 25 is formed in the second hole structure 32, the first photoresist layer 81 is removed. The first photoresist layer 81 may be removed by means of a dry method or a wet method. For example, the first photoresist layer 81 is removed by means of ashing.

Step S103, forming a capacitor structure on the central region, wherein the capacitor structure is electrically connected to the wordline structure.

Figure 7:
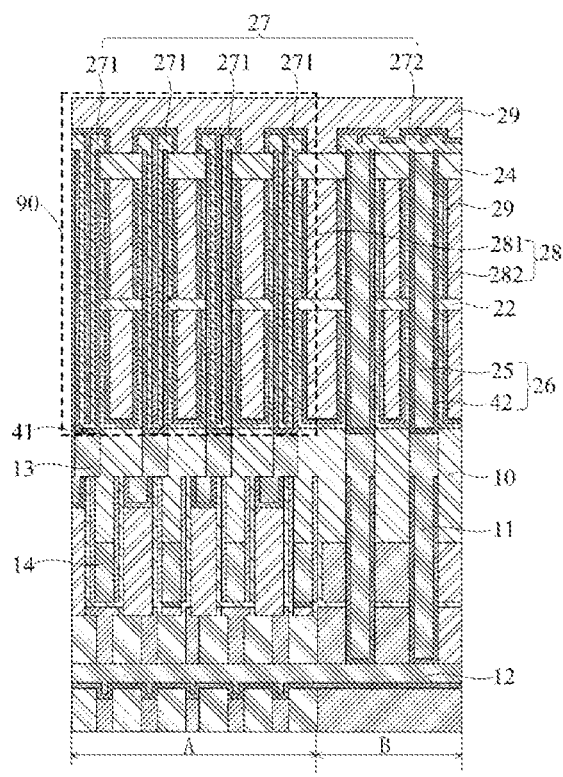
FIG. 7 is a schematic structural diagram of a second conductive layer formed according to an embodiment of the present disclosure.

In some embodiments of the present disclosure, the capacitor structure 90 is positioned above the central region of the substrate 10, as shown by the dashed lines in FIG. 7. The capacitor structure 90 corresponds to, and is electrically connected to the capacitor contact structure 13 in the substrate 10, and the capacitor contact structure 13 is electrically connected to the wordline structure 12, such that the capacitor structure 90 may be electrically connected to the wordline structure 12 by means of the capacitor contact structure 13.

In some embodiments of the present disclosure, the capacitor structure 90 may be formed through the following steps.

The first insulating layer 21 and the second insulating layer 23 are removed to form a cavity structure. The first supporting layer 22 and second supporting layer 24 remained are configured to support two adjacent lower electrode layers 40, such that each of the lower electrode layers 40 may have better stability when each of the lower electrode layers 40 has a larger slenderness ratio.

After the cavity structure is formed, a dielectric layer 27 is formed on a surface of the lower electrode layer 40. The material of the dielectric layer 27 is an insulating material. For example, the dielectric layer 27 may be a composite layer of zirconia and aluminum oxide. The dielectric layer 27 may have a larger dielectric constant, such that dielectric layer 27 has better insulating property. As shown in FIG. 7, the dielectric layer 27 covers the lower electrode layer 40, and the dielectric layer 27 serves as a stored charge.

After the dielectric layer 27 is formed, an upper electrode layer 28 is formed on a surface of the dielectric layer 27. The upper electrode layer 28 is arranged opposite to the lower electrode layer 40, and the upper electrode layer 28, the lower electrode layer 40 and the dielectric layer 27 positioned on the central region form a capacitor. That is, the first lower electrode layer 41, the upper electrode layer 28 corresponding to the first lower electrode layer 41, and the dielectric layer 27 corresponding to the first lower electrode layer 41 constitute the capacitor.

After the upper electrode layer 28 is formed, a second conductive layer 29 is formed on a surface of the upper electrode layer 28, wherein the second conductive layer 29 fills up the cavity structure and covers the upper electrode layer 28. The lower electrode layer 40, the dielectric layer 27, the upper electrode layer 28 and the second conductive layer 29 positioned on the central region constitute the capacitor structure 90.

For convenience of description, with reference to FIG. 7, the dielectric layer 27 positioned on the central region is defined as a first dielectric layer 271, and the dielectric layer 27 positioned on the edge region is defined as a second dielectric layer 272. The upper electrode layer 28 positioned on the central region is defined as a first upper electrode layer 281, and the upper electrode layer 28 positioned on the edge region is defined as a second upper electrode layer 282. As shown in FIG. 7, the first dielectric layer 271 and the first upper electrode layer 281 are both opposite to the first lower electrode layer 41; and the second dielectric layer 272 and the second upper electrode layer 282 are both opposite to the second lower electrode layer 42.

As shown in FIG. 7, the capacitor includes the first lower electrode layer 41, the first dielectric layer 271, and the first upper electrode layer 281. The capacitor and the second conductive layer 29 positioned on the central region constitute the capacitor structure 90. In some embodiments of the present disclosure, the second conductive layer 29 is electrically connected to the upper electrode layer 28, such that the capacitor can be controlled by means of the second conductive layer 29. The material of the second conductive layer 29 may be silicon germanium.

Step 104, forming a third contact structure on the second contact structure, wherein the third contact structure is electrically connected to the second contact structure.

With reference to FIGS. 8 to 12, the third contact structure 52 corresponds to and is electrically connected to the second contact structure 26, such that the third contact structure 52 can be electrically connected to the wordline structure 12 in the substrate 10. In some embodiments of the present disclosure, the third contact structure 52 may be positioned right above the second contact structure 26 to facilitate the formation of the third contact structure 52. Furthermore, the third contact structure 52 is in contact with the second contact structure 26, and the third contact structure 52 is made from an electrically conductive material to implement the electrical connection between the third contact structure 52 and the second contact structure 26.

In a possible example, forming the third contact structure 52 on the second contact structure 26 may include the following steps.

Figure 8:
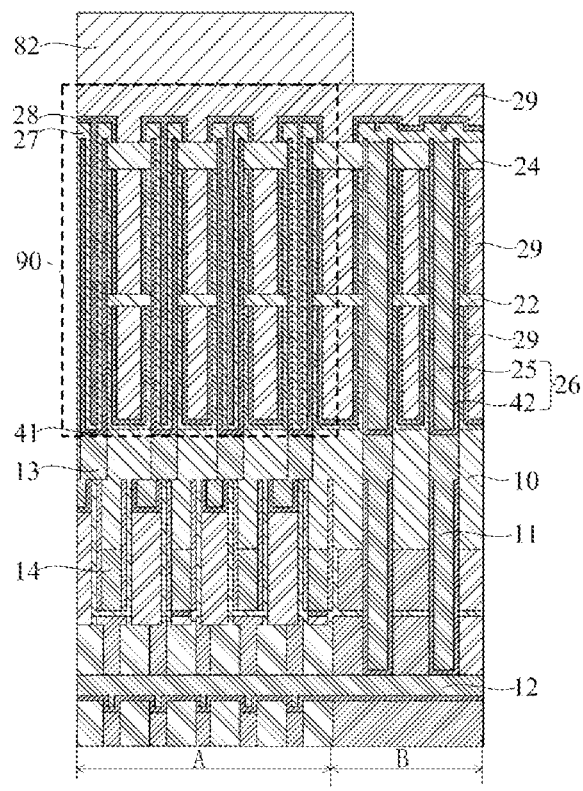
FIG. 8 is a schematic structural diagram of a second photoresist layer formed according to an embodiment of the present disclosure.

First, the dielectric layer 27, the upper electrode layer 28 and the second conductive layer 29 positioned above the edge region are removed to expose the second contact structure 26. With reference to FIG. 8, a second photoresist layer 82 is formed on the second conductive layer 29, and the second photoresist layer 82 covers a part of the second conductive layer 29 corresponding to the central region of the substrate 10. By means of the second photoresist layer 82 as a mask, the second conductive layer 29, the dielectric layer 27 and the upper electrode layer 28 on the edge region are etched to remove a part of the dielectric layer 27, a part of the upper electrode layer 28 and a part of the second conductive layer 29, such that the second contact structure 26 is exposed. Next, the second photoresist layer 82 is removed.

Figure 9:
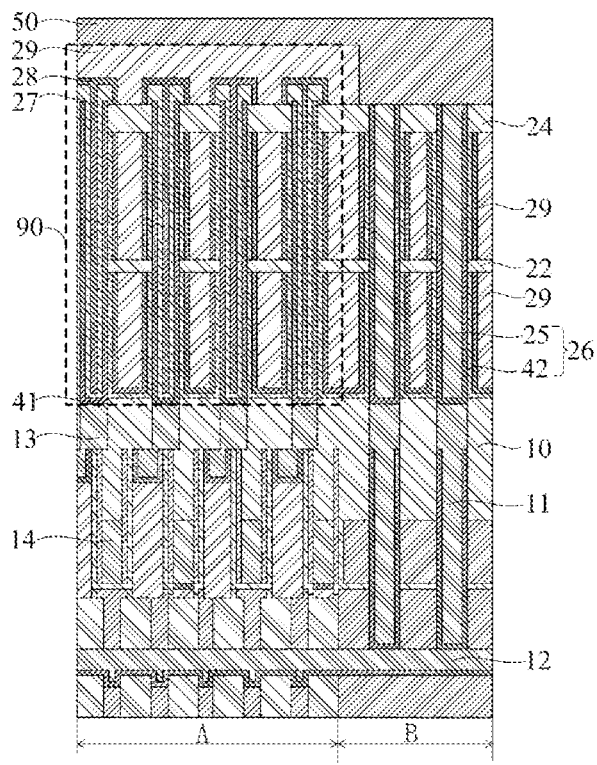
FIG. 9 is a schematic structural diagram of a third insulating layer formed according to an embodiment of the present disclosure.
Figure 10:
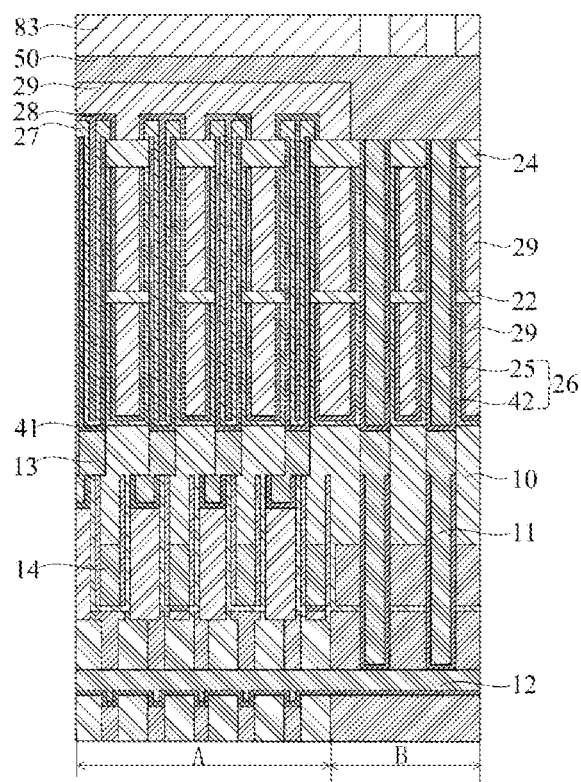
FIG. 10 is a schematic structural diagram of a third photoresist layer formed according to an embodiment of the present disclosure.

Next, a third insulating layer 50 is formed on the capacitor structure 90 and the second contact structure 26. With reference to FIG. 9, the third insulating layer 50 may be formed by means of a chemical vapor deposition method to cover the second conductive layer 29 and the second contact structure 26, which can provide an insulated protection to the capacitor structure 90 in one aspect, and can support the third contact structure 52 in another aspect. As shown in FIG. 9, an upper surface of the third insulating layer 50 is flush, ensuring that the upper surface has better flatness, such that other layers can be easily formed on the third insulating layer 50.

Figure 11:
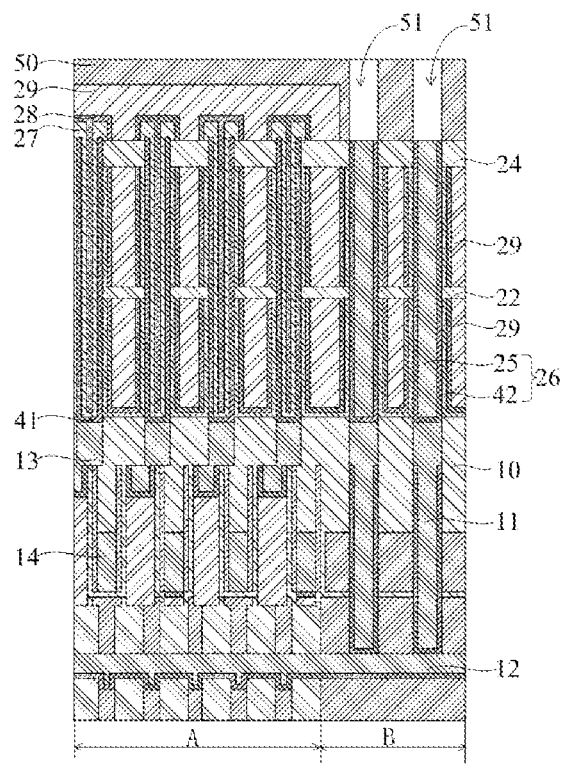
FIG. 11 is a schematic structural diagram of a third hole structure formed according to an embodiment of the present disclosure.

Next, a part of the third insulating layer 50 is removed to form a third hole structure 51, wherein the third hole structure 51 exposes the second contact structure 26. Exemplarily, with reference to FIG. 10, a third photoresist layer 83 is formed on the third insulating layer 50, wherein the third photoresist layer has a pattern required. The third insulating layer 50 is etched by means of the third photoresist layer 83 as a mask, such that a third hole structure 51 is formed in the third insulating layer 50. As shown in FIG. 11, the third hole structure 51 penetrates through the third insulating layer 50 and exposes the second contact structure 26. Next, the third photoresist layer 83 is removed.

Figure 12:
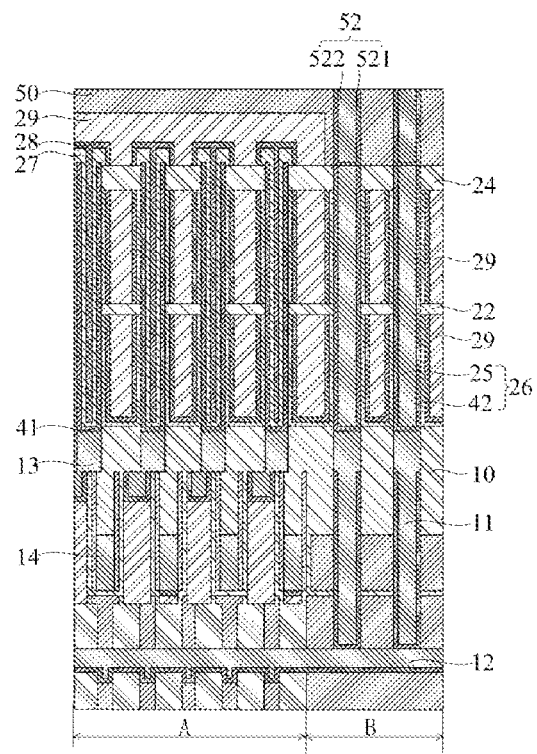
FIG. 12 is a schematic structural diagram of a third contact structure formed according to an embodiment of the present disclosure.

Next, a barrier layer 521 and a third conductive layer 522 are formed in the third hole structure 51, wherein the barrier layer 521 and the third conductive layer 522 constitute the third contact structure 52. The barrier layer 521 is first formed on lateral surfaces and a bottom surface of the third hole structure 51, wherein the barrier layer 521 formed is provided with a middle hole. Next, the third conductive layer 522 is deposited in the middle hole. As shown in FIG. 12, an upper surface of the third conductive layer 522 is flush with that of the third insulating layer 50.

In some embodiments of the present disclosure, reference may be made to the second contact structure 26 and the first contact structure 11 for the material of the third contact structure 52, which is not unnecessarily elaborated any more herein.

Step S105, forming a transistor structure on the capacitor structure and the third contact structure, wherein the transistor structure is electrically connected to the wordline structure, and orthographic projections of the capacitor structure and the third contact structure on the substrate at least partially cover an orthographic projection of the transistor structure on the substrate.

Figure 16:
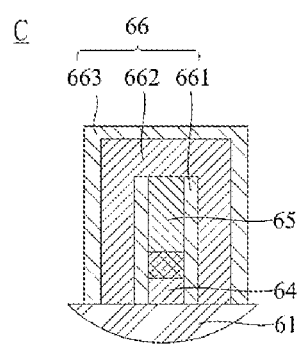
FIG. 16 is a partial enlarged view of Part C in FIG. 15.
Figure 17:
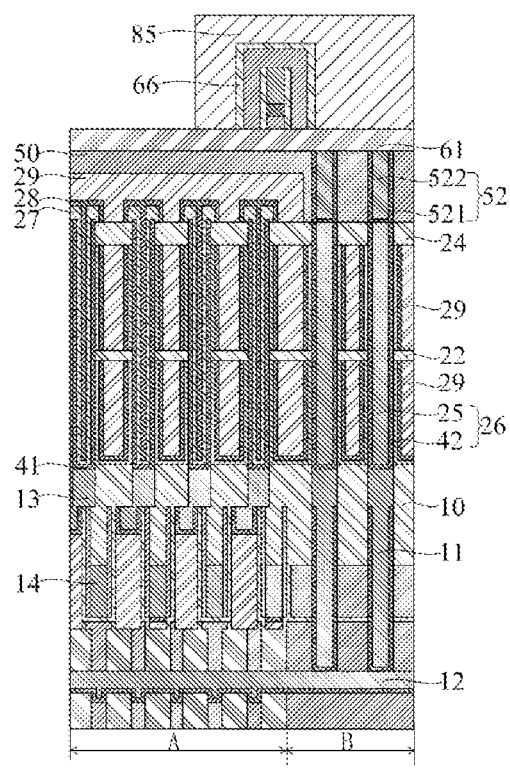
FIG. 17 is a schematic structural diagram of a fifth photoresist layer formed according to an embodiment of the present disclosure.
Figure 18:
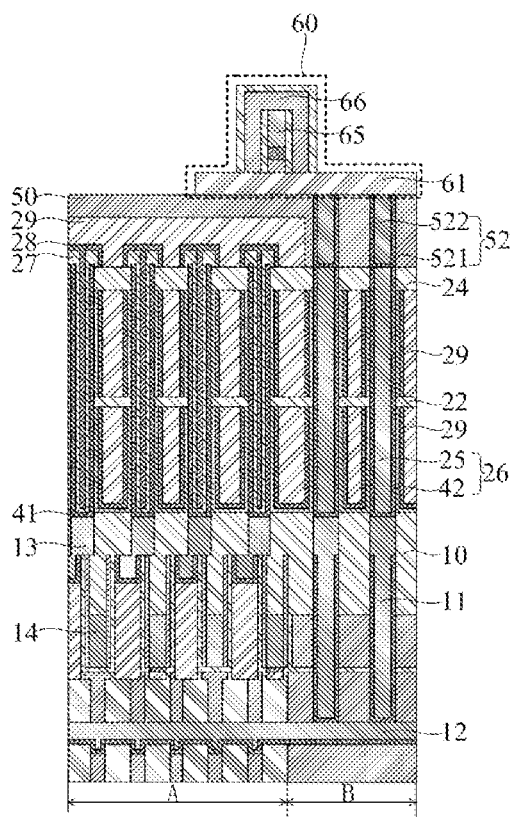
FIG. 18 is a schematic structural diagram of a part of polysilicon layer removed according to an embodiment of the present disclosure.

With reference to FIGS. 13-21, the transistor structure 60 is as shown by the dashed line in FIG. 18. The transistor structure 60 is at least partially positioned in a region right above the capacitor structure 90 and the third contact structure 52. Compared with a technical solution where the transistor structure 60 is arranged beside the capacitor structure 90, in this embodiment of the present disclosure, space beside the capacitor structure 90 is freed up, which can increase a scope for arranging the capacitor structure 90, such that more capacitors can be arranged in the capacitor structure 90, and thus the storage density of the memory can be increased.

In a possible example, the transistor structure 60 may be formed through the following processes.

Figure 13:
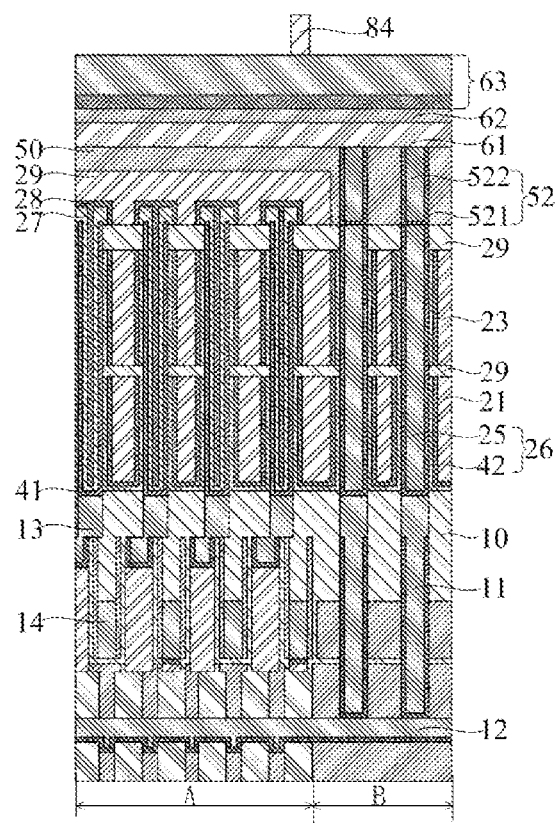
FIG. 13 is a schematic structural diagram of a fourth photoresist layer formed according to an embodiment of the present disclosure.

A polysilicon layer 61, an oxide layer 62 and a gate layer 63 are deposited on the third insulating layer 50, wherein the polysilicon layer 61 covers the third insulating layer 50 and the third contact structure 52. With reference to FIG. 13, the polysilicon layer 61, the oxide layer 62 and the gate layer 63 may be sequentially deposited and formed on the third insulating layer 50, wherein the gate layer 63 includes a titanium nitride layer formed on the oxide layer 62, and a metal layer formed on the titanium nitride layer, such as a tungsten layer or a tungsten alloy layer.

Figure 14:
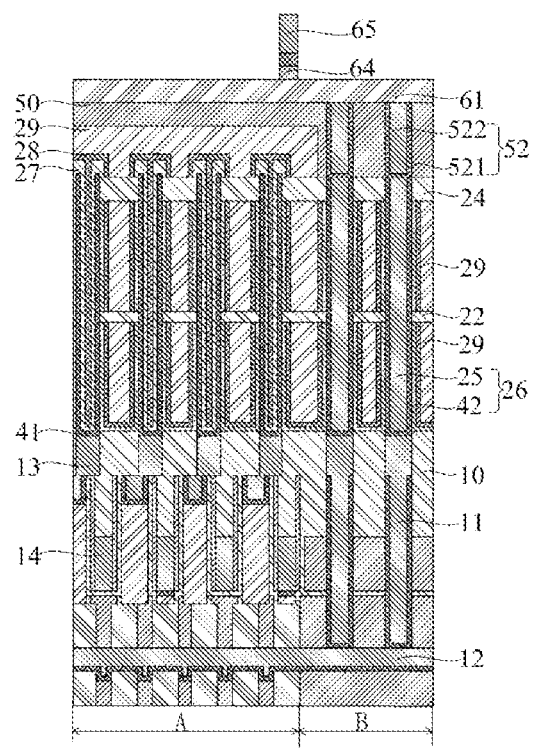
FIG. 14 is a schematic structural diagram of a gate structure formed according to an embodiment of the present disclosure.

After the polysilicon layer 61, the oxide layer 62 and the gate layer 63 are formed, a part of the oxide layer 62 and a part of the gate layer 63 are removed to form a gate oxide layer 64 and a gate structure 65. Exemplarily, a fourth photoresist layer 84 is formed on the gate layer 63, and the oxide layer 62 and the gate layer 63 are etched by means of the fourth photoresist layer 84 as a mask. As shown in FIG. 14, the remained gate layer 63 forms the gate structure 65, and the remained oxide layer 62 forms the gate oxide layer 64.

After the gate oxide layer 64 and the gate structure 65 are formed, ions are doped into the polysilicon layer 61 by means of an ion implantation technology to form a source structure and a drain structure, wherein the source structure and the drain structure are not shown in the figures. The source structure or the drain structure is electrically connected to the third contact structure 52, such that the transistor structure 60 may connect to the wordline structure 12 in the substrate 10 sequentially by means of the third contact structure 52, the second contact structure 26, and the first contact structure 11. In this way, the transistor structure 60 can control, by means of the wordline structure 12, the capacitor structure 90 to read or output data.

After the source structure and the drain structure are formed, a gate protection layer 66 is formed on the polysilicon layer 61. The source structure, the drain structure, the gate oxide layer 64, the gate structure 65 and the gate protection layer 66 constitute the transistor structure 60.

Figure 15:
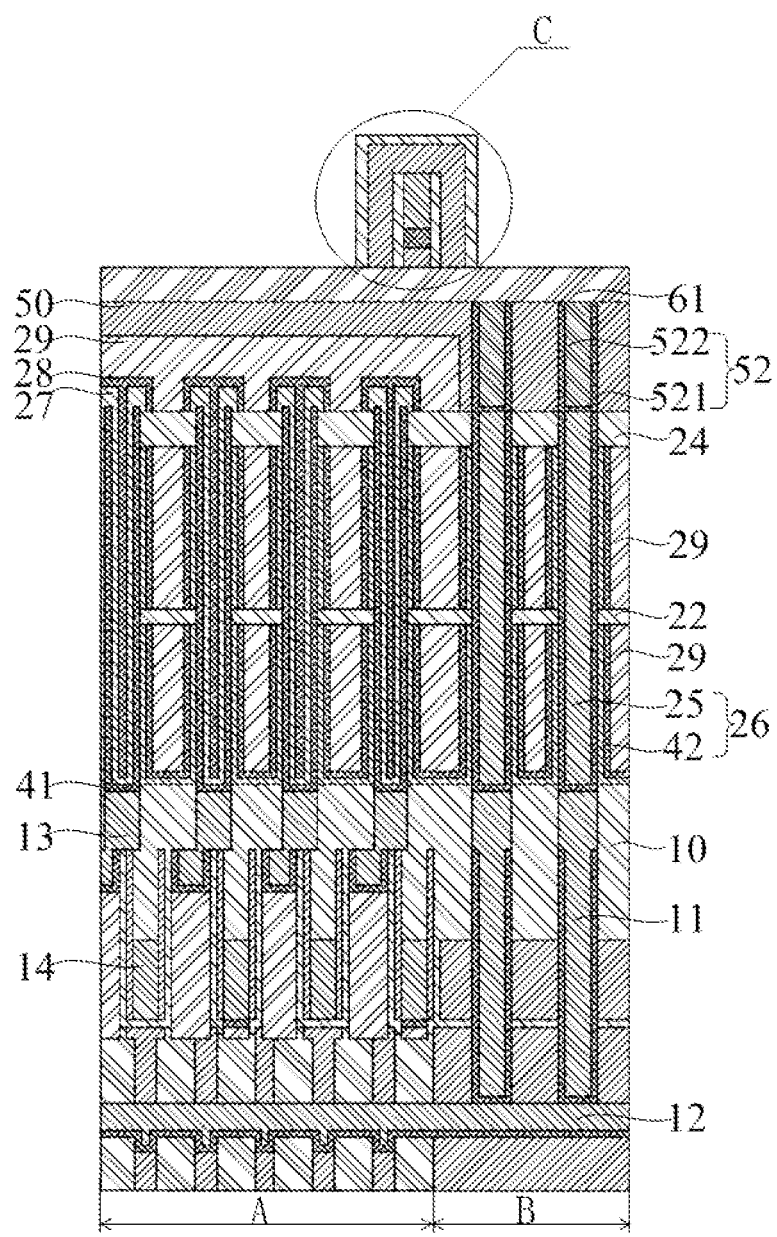
FIG. 15 is a schematic structural diagram of a gate protection layer formed according to an embodiment of the present disclosure.

With reference to FIG. 15 and FIG. 16, the gate protection layer 66 may include a first protection layer 661, a second protection layer 662 and a third protection layer 663 formed on lateral surfaces of the gate oxide layer 64 and the gate structure 65. The gate protection layer 66 may adopt an NON (SIN-Oxide-SIN) structure. That is, the material forming the first protection layer 661 is silicon nitride, the material forming the second protection layer 662 is silicon oxide, and the material forming the third protection layer 663 is silicon nitride. In this way, it is ensured that the gate structure 65 is well protected, and a dielectric constant of the gate protection layer 66 can be reduced, such that a parasitic capacitance can be reduced, and performance of the memory can be ensured.

In the fabrication method of the memory provided by this embodiment of the present disclosure, the substrate 10 comprises an edge region and a central region connected to each other. A first contact structure 11 electrically connected to a wordline structure 12 in the substrate 10 is formed in the edge region. A second contact structure 26 electrically connected to the first contact structure 11 is formed on the edge region. A third contact structure 52 electrically connected to the second contact structure 26 is formed on the second contact structure 26. A capacitor structure 90 electrically connected to the wordline structure 12 is formed on the central region, and a transistor structure 60 electrically connected to the wordline structure 12 is formed on the capacitor structure 90 and the third contact structure 52. The transistor structure 60 is electrically connected to the wordline structure 12 through the third contact structure 52, the second contact structure 26 and the first contact structure 11, and the capacitor structure 90 is electrically connected to the wordline structure 12, such that the transistor structure 60 can control, by means of the wordline structure 12, the capacitor structure 90 to read or output data. Furthermore, an orthographic projection of the transistor structure 60 on the substrate 10 is at least partially coincident with orthographic projections of the capacitor structure 90 and the third contact structure 52 on the substrate 10, such that the transistor structure 60 is at least partially positioned on a region right above the capacitor structure 90 and the third contact structure 52. Compared with a technical solution in the related technologies where the transistor structure 60 is positioned beside the capacitor structure 90, in this embodiment of the present disclosure, it is not required to provide the transistor structure 60 on lateral sides of the capacitor structure 90, which can increase a scope for arranging the capacitor structure 90, such that more capacitors can be arranged in the capacitor structure 90, and thus the storage density of the memory can be increased.

In some embodiments of the present disclosure, after the transistor structure 60 is formed, the fabrication method of the memory further includes: removing a part of the polysilicon layer 61 positioned above the capacitor structure 90.

Exemplarily, with reference to FIG. 17, a fifth photoresist layer 85 is formed on the transistor structure 60, and the fifth photoresist layer 85 exposes a part of the polysilicon layer 61 positioned on the central region. With reference to FIG. 18, a part of the polysilicon layer 61 is etched by means of the fifth photoresist layer 85 as a mask, such that a part of the third insulating layer 50 positioned on the central region is exposed, to prevent the fourth contact structure 71 from being short-circuited to the transistor structure 60 when the fourth contact structure 71 is formed subsequently, which may cause the memory to fail to work properly.

With reference to FIGS. 18 to 21, in some embodiments of the present disclosure, after the transistor structure 60 is formed, the fabrication method of the memory further includes the following steps: forming the fourth contact structure 71, a fifth contact structure 72 and a sixth contact structure 73 on the capacitor structure 90 and the transistor structure 60, wherein the fourth contact structure 71 is electrically connected to the capacitor structure 90, the fifth contact structure 72 is electrically connected to the source structure or the drain structure, and the sixth contact structure 73 is electrically connected to the gate structure 65.

In some embodiments of the present disclosure, an external circuit and the memory are electrically connected by means of the fourth contact structure 71, the fifth contact structure 72, and the sixth contact structure 73.

Figure 19:
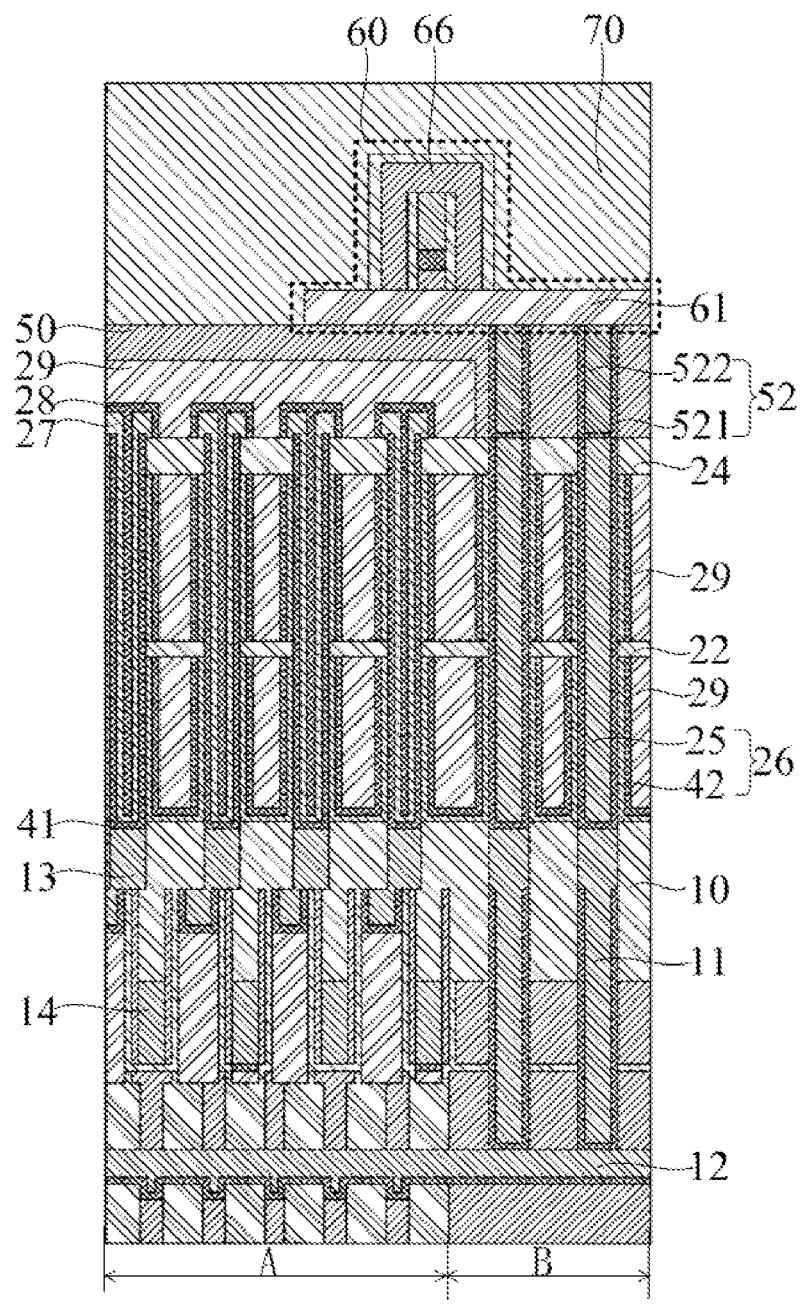
FIG. 19 is a schematic structural diagram of a fourth insulating layer formed according to an embodiment of the present disclosure.

It is to be noted that before the fourth contact structure 71 is formed, a fourth insulating layer 70 may be first formed on the transistor structure 60 and the third insulating layer 50. As shown in FIG. 19, the fourth contact structure 71, the fifth contact structure 72 and the sixth contact structure 73 required are formed in the fourth insulating layer 70.

Figure 20:
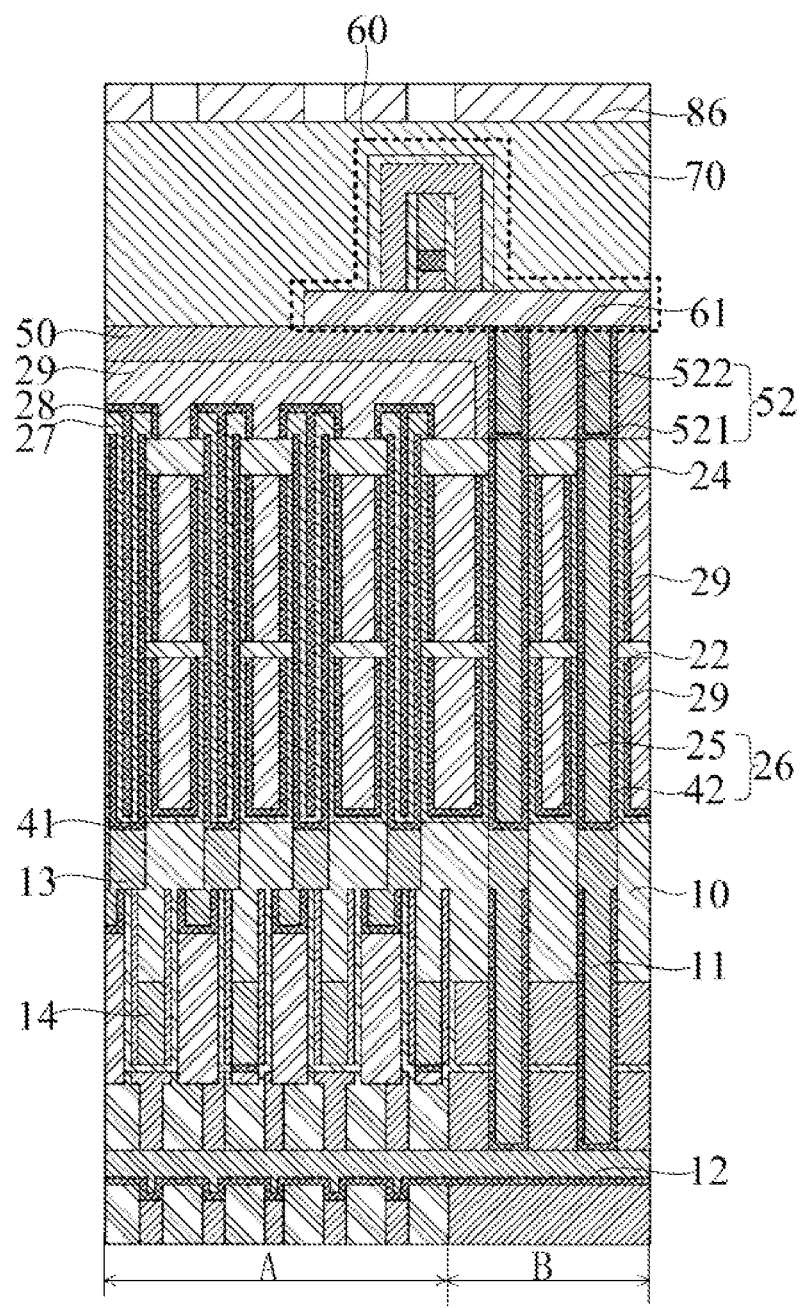
FIG. 20 is a schematic structural diagram of a sixth photoresist layer formed according to an embodiment of the present disclosure.

Exemplarily, when the fourth contact structure 71, the fifth contact structure 72 and the sixth contact structure 73 required are formed in the fourth insulating layer 70, a sixth photoresist layer 86 may be first formed on the fourth insulating layer 70. As shown in FIG. 20, the sixth photoresist layer 86 has a pattern required. Next, the fourth insulating layer 70 is etched by means of the sixth photoresist layer 86 to form a fourth hole structure, a fifth hole structure, and a sixth hole structure. The fourth hole structure exposes the capacitor structure 90, the fifth hole structure exposes the source structure or the drain structure in the polysilicon layer 61, and the sixth hole structure exposes the gate structure 65. Next, the sixth photoresist layer 86 is removed.

Figure 21:
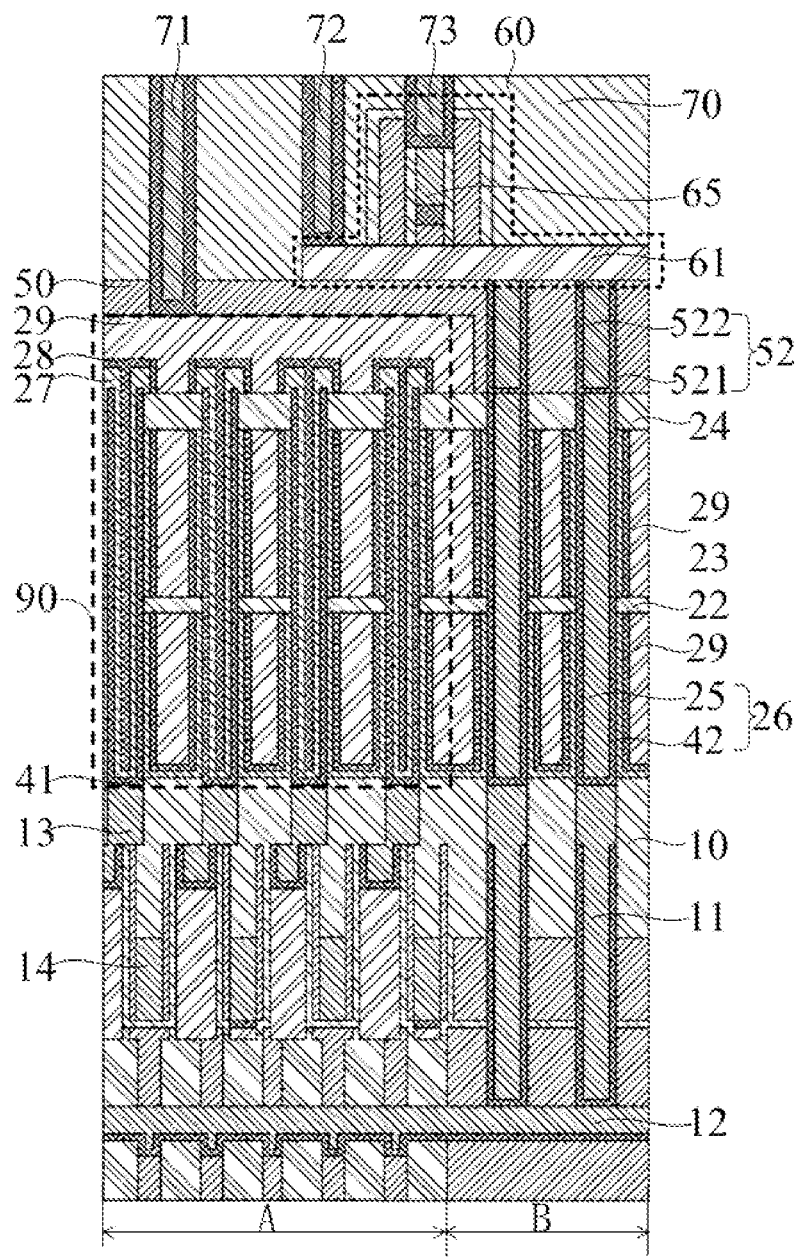
FIG. 21 is a schematic structural diagram of a fourth contact structure, a fifth contact structure and a sixth contact structure formed according to an embodiment of the present disclosure.

The electrically conductive material is respectively deposited in the fourth hole structure, the fifth hole structure and the sixth hole structure to form the fourth contact structure 71, the fifth contact structure 72, and the sixth contact structure 73, respectively. As shown in FIG. 21, the fourth contact structure 71 is in contact with and connects to the capacitor structure 90, the fifth contact structure 72 is electrically connected to the source structure or the drain structure, and the sixth contact structure 73 is electrically connected to the gate structure 65. In some embodiments of the present disclosure, one of the source structure and the drain structure is electrically connected to the third contact structure 52, and the other one is electrically connected to the fifth contact structure 72.

That is, the fourth contact structure 71, the fifth contact structure 72 and the sixth contact structure 73 may be simultaneously formed in the fourth insulating layer 70. Exemplarily, the electrically conductive material is simultaneously and respectively deposited in the fourth hole structure, the fifth hole structure and the sixth hole structure, such that the fourth contact structure 71, the fifth contact structure 72 and the sixth contact structure 73 are simultaneously formed. In this way, fabrication efficiency of the memory is increased.

It is to be noted that the fourth contact structure 71, the fifth contact structure 72 and the sixth contact structure 73 may also be formed separately, which is not limited in some embodiments of the present disclosure. Reference may be made to the first contact structure 11 for the materials of the fourth contact structure 71, the fifth contact structure 72 and the sixth contact structure 73, which is not unnecessarily elaborated any more herein.

With reference to FIG. 21, this embodiment of the present disclosure also provides a memory, which includes a substrate 10. The substrate 10 includes a central region and an edge region, wherein the central region is adjacent to and connected to the edge region. The central region is positioned in the region as shown at Part A in FIG. 21, and the edge region is positioned in the region as shown at Part B in FIG. 21. The substrate 10 is provided with a wordline structure 12, wherein a part of the wordline structure 12 is positioned in the central region, and another part of the wordline structure 12 is positioned in the edge region. That is, as shown in FIG. 21, the wordline structure 12 penetrates through an interface between the central region and the edge region to implement electrical connection between structures required in the central region and the edge region.

With continued reference to FIG. 21, the edge region is internally provided with a first contact structure 11, wherein an end of the first contact structure 11 is flush with an end of the substrate 10, and another end of the first contact structure 11 is electrically connected to the wordline structure 12. As shown in FIG. 21, an upper end of the first contact structure 11 is flush with an upper end of the substrate 10, and a lower end of the first contact structure 11 is in contact with the wordline structure 12, wherein the first contact structure 11 is made from an electrically conductive material. In this way, the electrical connection between the first contact structure 11 and the wordline structure 12 is implemented.

The central region is internally provided with a bitline structure 14 and a capacitor contact structure 13 arranged at intervals. An end of the capacitor contact structure 13 is electrically connected to the wordline structure 12, and another end of the capacitor contact structure 13 is connected to a capacitor structure 90, to implement connectivity between the wordline structure 12 and the capacitor structure 90. In this way, the capacitor structure 90 is controlled to read and output data.

Connectivity between the bitline structure 14 and the capacitor contact structure 13 and connectivity between the bitline structure 14 and the wordline structure 12 are disabled, to prevent the occurrence of a short circuit, which may cause the memory to fail to work properly.

The bitline structure 14, the capacitor contact structure 13, the wordline structure 12 and the first contact structure 11 may be made of the same material. In some embodiments of the present disclosure, the material of the three structures is metal material, such as tungsten or tungsten alloy. As shown in FIG. 2, a lower surface of the wordline structure 12, a lower surface and a part of lateral surfaces of the capacitor contact structure 13, and a lower surface and a part of lateral surfaces of the first contact structure 11 all include a metal barrier layer such as a titanium nitride layer, to prevent metal from spreading out.

With continued reference to FIG. 21, a capacitor structure 90 is formed above the central region, wherein the capacitor structure 90 is electrically connected to the wordline structure 12. The capacitor structure 90 includes a capacitor and a second conductive layer 29 covering the capacitor, and the second conductive layer 29 is electrically connected to the capacitor.

Figure 22:
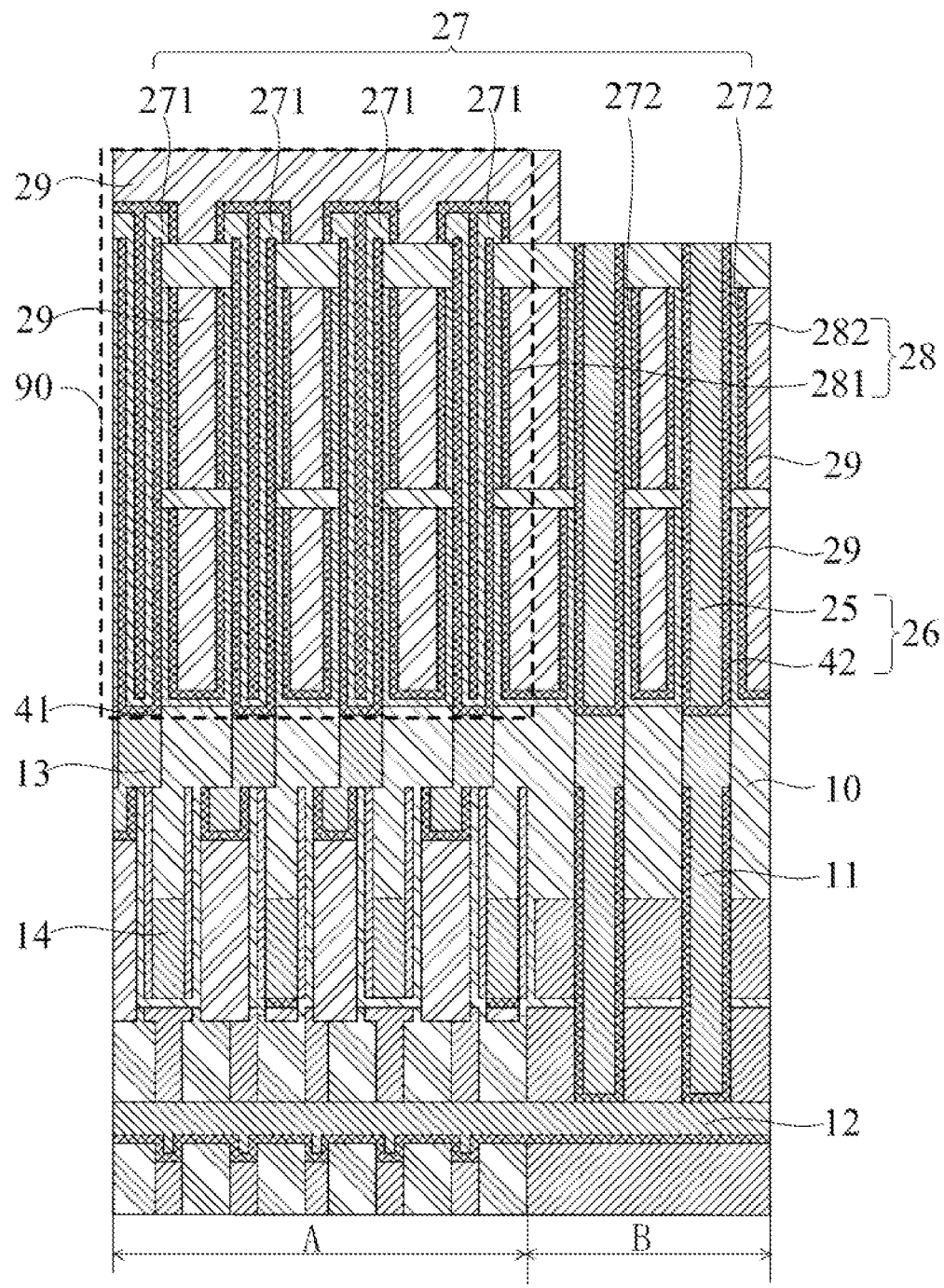
FIG. 22 is a partial schematic view of a memory according to an embodiment of the present disclosure.

With reference to FIG. 22, the capacitor includes a first lower electrode layer 41, a first dielectric layer 271, and a first upper electrode layer 281, wherein the first lower electrode layer 41 is electrically connected to the capacitor contact structure 13. Exemplarily, the first lower electrode layer 41 is made from an electrically conductive material and is in contact with the capacitor contact structure 13.

A first dielectric layer 271 is formed on the surface of the first lower electrode layer 41. That is, the first dielectric layer 271 is positioned on the central region. Exemplarily, the first dielectric layer 271 is formed on both outer lateral surfaces and inner lateral surfaces of the first lower electrode layer 41. That is, the first dielectric layer 271 covers the first lower electrode layer 41.

A first upper electrode layer 281 is formed on the surface of the first dielectric layer 271. That is, the first upper electrode layer 281 is positioned on the central region. The first upper electrode layer 281 is formed on the outer lateral surfaces and in interior holes of the first dielectric layer 271. With reference to FIG. 21, a part of the first upper electrode layer 281 is positioned on an inner side of the first lower electrode layer 41, and another part of the first upper electrode layer 281 is positioned on an outer side of the first lower electrode layer 41.

A part of the second conductive layer 29 is filled between the first upper electrode layers 281, and a part of the second conductive layer 29 is also covered on the first upper electrode layer 281. That is, the first upper electrode layer 281 is positioned inside the second conductive layer 29. The upper surface of the second conductive layer 29 corresponding to the first upper electrode layer 281 is flush to facilitate the formation of other layers.

With continued reference to FIG. 21, the second conductive layer 29 also extends above the edge region. That is, a part of the second conductive layer 29 is positioned above the central region, and another part of the second conductive layer 29 is positioned above the edge region. A second contact structure 26 is formed in the second conductive layer 29 positioned above the edge region.

The second contact structure 26 penetrates through the second conductive layer 29 and is in contact with the first contact structure 11. The second contact structure 26 may be made from an electrically conductive material, to facilitate the electrical connection between the second contact structure 26 and the first contact structure 11. The second contact structure 26 may be positioned right above the first contact structure 11 to facilitate its formation.

The second contact structure 26 includes a second lower electrode layer 42 and a first conductive layer 25 formed in the second lower electrode layer 42. As shown in FIG. 22, a second dielectric layer 272 is formed on the outer lateral surfaces of the second lower electrode layer 42, a second upper electrode layer 282 is formed on the outer lateral surfaces of the second dielectric layer 272, and a part of the second conductive layer 29 is filled in the region between the second upper electrode layers 282.

In some embodiments of the present disclosure, the first lower electrode layer 41 and the second lower electrode layer 42 constitute the lower electrode layer 40. The first dielectric layer 271 and the second dielectric layer 272 constitute the dielectric layer 27. The first upper electrode layer 281 and the second upper electrode layer 282 constitute the upper electrode layer 28. The lower electrode layer 40, the dielectric layer 27 and the upper electrode layer 28 all may be formed at one time to increase the fabrication efficiency of the memory.

With continued reference to FIG. 21, a third contact structure 52 is formed on the second contact structure 26, and the third contact structure 52 is electrically connected to the second contact structure 26. In some embodiments of the present disclosure, a third insulating layer 50 is formed on the second conductive layer 29, and the upper surface of the third insulating layer 50 is flush, such that other layers can be easily formed on the third insulating layer 50. The third contact structure 52 penetrating through the third insulating layer 50 is formed in the third insulating layer 50, and the third contact structure 52 is in contact with the second contact structure 26. In some embodiments of the present disclosure, the third contact structure 52 includes a barrier layer 521 in contact with the third insulating layer 50, and a third conductive layer 522 positioned inside the barrier layer 521.

A transistor structure 60 is formed on the capacitor structure 90 and the third contact structure 52, wherein the transistor structure 60 is electrically connected to the third contact structure 52. The orthographic projection of the transistor structure 60 on the substrate 10 is at least partially coincident with the orthographic projections of the capacitor structure 90 and the third contact structure 52 on the substrate 10. Based on such an arrangement, the transistor structure 60 is at least partially positioned in the region right above the capacitor structure 90 and the third contact structure 52, which allows the capacitor structure 90 to have a larger space ratio in the memory, such that more capacitors can be arranged in the capacitor structure 90, and thus the storage density of the memory can be increased.

The transistor structure 60 includes a source structure, a drain structure, a gate oxide layer 64, a gate structure 65, and a gate protection layer 66. The source structure and the drain structure are formed in the polysilicon layer 61 by means of an ion implantation technology, and one of the source structure and the drain structure is electrically connected to the third contact structure 52.

In some embodiments of the present disclosure, the source structure and the drain structure are not marked in the figures. The source structure or the drain structure is in contact with the third contact structure 52, such that the transistor structure 60 is electrically connected to the wordline structure 12. Thus, the transistor structure 60 can control, by means of the wordline structure 12, the capacitor structure 90 to read or output data.

It is to be noted that a fourth insulating layer 70 is formed on the third insulating layer 50, and the transistor structure 60 is formed in the fourth insulating layer 70. For example, the polysilicon layer 61 in contact with the third insulating layer 50 is formed in the fourth insulating layer 70. The polysilicon layer 61 is positioned above the third contact structure 52 and a part of the capacitor structure 90, to prevent, when the fourth contact structure 71 electrically connected to the capacitor structure 90 is formed, the transistor structure 60 from being short-circuited to the capacitor structure 90 caused by connectivity between the fourth contact structure 71 and the polysilicon layer 61.

The gate oxide layer 64 of the transistor structure 60 is formed on the polysilicon layer 61, the gate structure 65 is formed on the gate oxide layer 64, and the gate protection layer 66 covers the gate oxide layer 64 and the gate structure 65. In some possible examples, the gate protection layer 66 may include a first protection layer 661, a second protection layer 662 and a third protection layer 663 formed on lateral surfaces of the gate oxide layer 64 and the gate structure 65. The gate protection layer 66 may adopt an NON (SIN-Oxide-SIN) structure. That is, the material forming the first protection layer 661 is silicon nitride, the material forming the second protection layer 662 is silicon oxide, and the material forming the third protection layer 663 is silicon nitride. In this way, it is ensured that the gate structure 65 is well protected, and the dielectric constant of the gate protection layer 66 can be reduced, such that the parasitic capacitance can be reduced, and performance of the memory can be ensured.

With continued reference to FIG. 21, a fourth contact structure 71, a fifth contact structure 72 and a sixth contact structure 73 are also formed in the fourth insulating layer 70. The fourth contact structure 71 penetrates though the fourth insulating layer 70 and the third insulating layer 50 and is electrically connected to the capacitor structure 90. The fifth contact structure 72 extends to the polysilicon layer 61 and is in contact with the polysilicon layer 61, such that the fifth contact structure 72 is electrically connected to the source structure or the drain structure of the transistor structure 60. For example, the fifth contact structure 72 is electrically connected to the source structure. The sixth contact structure 73 extends to the gate structure 65 and is electrically connected to the gate structure 65 of the transistor structure 60.

The memory provided by this embodiment of the present disclosure comprises a substrate 10. The substrate 10 comprises an edge region and a central region connected to each other. A first contact structure 11 electrically connected to a wordline structure 12 in the substrate 10 is formed in the edge region. A second contact structure 26 electrically connected to the first contact structure 11 is formed on the edge region. A third contact structure 52 electrically connected to the second contact structure 26 is formed on the second contact structure 26. A capacitor structure 90 electrically connected to the wordline structure 12 is formed on the central region, and a transistor structure 60 electrically connected to the wordline structure 12 is formed on the capacitor structure 90 and the third contact structure 52. The transistor structure 60 is electrically connected to the capacitor structure 90 through the third contact structure 52, the second contact structure 26, the first contact structure 11 and the wordline structure 12, such that the transistor structure 60 can read or output data by controlling the capacitor structure 90 by means of the wordline structure 12. Furthermore, the orthographic projection of the transistor structure 60 on the substrate 10 is at least partially coincident with the orthographic projections of the capacitor structure 90 and the third contact structure 52 on the substrate 10, such that the transistor structure 60 is at least partially positioned on the region right above the capacitor structure 90 and the third contact structure 52. Compared with a technical solution in the related technologies where the transistor structure 60 is positioned beside the capacitor structure 90, in this embodiment of the present disclosure, it is not required to provide the transistor structure 60 on lateral sides of the capacitor structure 90, which can increase a scope for arranging the capacitor structure 90, such that more capacitors can be arranged in the capacitor structure 90, and thus the storage density of the memory can be increased.

The embodiments in the specification are described in a progressive manner. Each of the embodiments is focused on difference from other embodiments. And cross reference is available for identical or similar parts among different embodiments.

It is to be understood by those skilled in the art that in the disclosure of the present disclosure, the orientations or positions represented by the terms of "longitudinal", "lateral", "up", "down", "front", "back", "left", "right", "vertical", "horizontal", "top", "bottom", "in", "out", and the like are based on the orientations or positions as shown in the accompanying drawings, they are merely for ease of a description of the present disclosure and a simplified description instead of being intended to indicate or imply the system or component to have a special orientation or to be configured and operated in a special orientation. Thus, the above terms cannot be understood as limiting of the present disclosure.

In the descriptions of this specification, descriptions of reference terms "one embodiment", "some embodiments", "an exemplary embodiment", "an example", "one example", or "some examples" are intended to indicate that features, structures, materials, or characteristics described with reference to the embodiment or example are included in at least one embodiment or example of this present disclosure. The schematic representation of the above terms throughout this specification is not necessarily referring to the same embodiment or example. Furthermore, the features, structures, materials, or characteristics set forth may be combined in any suitable manner in one or more embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

The invention claimed is:

1. A fabrication method of a memory, comprising:
   providing a substrate, the substrate comprising a central region and an edge region connected to the central region, a first contact structure being formed in the edge region, and the first contact structure being electrically connected to a wordline structure in the substrate;
   forming a second contact structure on the edge region, the second contact structure being electrically connected to the first contact structure;
   forming a capacitor structure on the central region, the capacitor structure being electrically connected to the wordline structure;
   forming a third contact structure on the second contact structure, the third contact structure being electrically connected to the second contact structure; and
   forming a transistor structure on the capacitor structure and the third contact structure, the transistor structure being electrically connected to the third contact structure, and an orthographic projection of the transistor structure on the substrate being at least partially coincident with orthographic projections of the capacitor structure and the third contact structure on the substrate.

2. The fabrication method according to claim 1, wherein before the second contact structure is formed on the edge region, the fabrication method further comprises:
   forming a mask layer having a hole structure on the substrate; and
   forming a lower electrode layer on an inner surface and a bottom of the hole structure.

3. The fabrication method according to claim 2, wherein the hole structure comprises a first hole structure and a second hole structure, the first hole structure being positioned on the central region, the second hole structure being positioned on the edge region; and wherein the second hole structure exposes the first contact structure.

4. The fabrication method according to claim 3, wherein the lower electrode layer comprises a first lower electrode layer and a second lower electrode layer, the first lower electrode layer being arranged in the first hole structure, and the second lower electrode layer being arranged in the second hole structure.

5. The fabrication method according to claim 3, wherein the substrate further comprises a bitline structure and a capacitor contact structure arranged at intervals, the first hole structure exposing the capacitor contact structure, an end of the capacitor contact structure being electrically connected to the wordline structure, and another end of the capacitor contact structure being connected to the capacitor structure.

6. The fabrication method according to claim 4, wherein forming a second contact structure on the edge region comprises:
   forming a first photoresist layer on the central region, the first photoresist layer covering the first hole structure and a part of the mask layer;
   forming a first conductive layer in the second hole structure, the first conductive layer and the second lower electrode layer constituting the second contact structure; and
   removing the first photoresist layer.

7. The fabrication method according to claim 2, wherein forming a mask layer having a hole structure on the substrate comprises:
   stacking an initial first insulating layer, an initial first supporting layer, an initial second insulating layer and an initial second supporting layer on the substrate; and
   removing, by etching, a part of the initial first insulating layer, a part of the initial first supporting layer, a part of the initial second insulating layer and a part of the initial second supporting layer, to form a first insulating layer having a hole structure, a first supporting layer having a hole structure, a second insulating layer having a hole structure, and a second supporting layer having a hole structure; the first insulating layer, the first supporting layer, the second insulating layer and the second supporting layer constituting the mask layer.

8. The fabrication method according to claim 7, wherein forming a capacitor structure on the central region comprises:
removing the first insulating layer and the second insulating layer to form a cavity structure;
forming a dielectric layer on a surface of the lower electrode layer;
forming an upper electrode layer on a surface of the dielectric layer; and
forming a second conductive layer on a surface of the upper electrode layer, the second conductive layer filling up the cavity structure and covering the upper electrode layer; and the lower electrode layer, the dielectric layer, the upper electrode layer and the second conductive layer positioned on the central region constituting the capacitor structure.

9. The fabrication method according to claim 8, wherein forming a third contact structure on the second contact structure comprises:
removing a part of the dielectric layer, a part of the upper electrode layer and a part of the second conductive layer on the edge region to expose the second contact structure;
forming a third insulating layer on the capacitor structure and the second contact structure;
removing a part of the third insulating layer to form a third hole structure that exposes the second contact structure; and
forming a barrier layer and a third conductive layer in the third hole structure, the barrier layer and the third conductive layer constituting the third contact structure.

10. The fabrication method according to claim 9, wherein forming a transistor structure on the substrate comprises:
depositing a polysilicon layer, an oxide layer and a gate layer in sequence on the third insulating layer, the polysilicon layer covering the third insulating layer and the third contact structure;
removing a part of the oxide layer and a part of the gate layer to expose a part of the polysilicon layer, the remained oxide layer forming a gate oxide layer, and the remained gate layer forming a gate structure;
doping ions into the polysilicon layer by means of an ion implantation technology to form a source structure and a drain structure; and
forming a gate protection layer on the polysilicon layer, the source structure, the drain structure, the gate oxide layer, the gate structure and the gate protection layer constituting the transistor structure.

11. The fabrication method according to claim 10, wherein after the transistor structure is formed on the substrate, the fabrication method further comprises:
forming a fourth contact structure, a fifth contact structure and a sixth contact structure arranged at intervals on the capacitor structure and the transistor structure, the fourth contact structure being electrically connected to the capacitor structure, the fifth contact structure being electrically connected to the source structure or the drain structure, and the sixth contact structure being electrically connected to the gate structure.

12. A memory, comprising:
a substrate, the substrate comprising a central region and an edge region connected to the central region, a first contact structure being formed in the edge region, and the first contact structure being electrically connected to a wordline structure in the substrate;
a capacitor structure, arranged on the central region and electrically connected to the wordline structure;
a second contact structure, arranged on the edge region and electrically connected to the first contact structure;
a third contact structure, arranged on the second contact structure and electrically connected to the second contact structure; and
a transistor structure, arranged on the capacitor structure and the third contact structure;
wherein the transistor structure is electrically connected to the third contact structure, and an orthographic projection of the transistor structure on the substrate is at least partially coincident with orthographic projections of the capacitor structure and the third contact structure on the substrate.

13. The memory according to claim 12, wherein the transistor structure comprises a source structure and a drain structure formed in a polysilicon layer, a gate oxide layer formed on the polysilicon layer, a gate structure formed on the gate oxide layer, and a gate protection layer covering the gate oxide layer and the gate structure.

14. The memory according to claim 13, wherein the memory further comprises a fourth contact structure, a fifth contact structure and a sixth contact structure arranged at intervals;
the fourth contact structure being electrically connected to the capacitor structure, the fifth contact structure being electrically connected to the source structure or the drain structure of the transistor structure, and the sixth contact structure being electrically connected to the gate structure of the transistor structure.

15. The memory according to claim 12, wherein the substrate further comprises a bitline structure and a capacitor contact structure arranged at intervals, an end of the capacitor contact structure is electrically connected to the wordline structure, and another end of the capacitor contact structure is connected to the capacitor structure.

* * * * *